(12) United States Patent
Togawa et al.

(10) Patent No.: US 10,193,021 B2
(45) Date of Patent: Jan. 29, 2019

(54) SEMICONDUCTOR LIGHT-EMITTING ELEMENT, AND MANUFACTURING METHOD FOR SAME

(71) Applicants: STANLEY ELECTRIC CO., LTD., Meguro-ku, Tokyo (JP); THE UNIVERSITY OF TOKYO, Bunkyo-ku, Tokyo (JP)

(72) Inventors: Hiroyuki Togawa, Tokyo (JP); Masakazu Sugiyama, Tokyo (JP)

(73) Assignees: STANLEY ELECTRIC CO., LTD., Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/561,028

(22) PCT Filed: Mar. 18, 2016

(86) PCT No.: PCT/JP2016/058676
§ 371 (c)(1),
(2) Date: Sep. 22, 2017

(87) PCT Pub. No.: WO2016/152772
PCT Pub. Date: Sep. 29, 2016

(65) Prior Publication Data
US 2018/0062037 A1 Mar. 1, 2018

(30) Foreign Application Priority Data
Mar. 23, 2015 (JP) ................................. 2015-059260

(51) Int. Cl.
*H01L 33/24* (2010.01)
*H01L 33/06* (2010.01)
(Continued)

(52) U.S. Cl.
CPC ............ *H01L 33/24* (2013.01); *H01L 33/007* (2013.01); *H01L 33/06* (2013.01); *H01L 33/145* (2013.01); *H01L 33/22* (2013.01); *H01L 33/32* (2013.01)

(58) Field of Classification Search
CPC combination set(s) only.
See application file for complete search history.

(56) References Cited

U.S. PATENT DOCUMENTS

| 10,043,944 B2 | 8/2018 | Zhang et al. |
| 2003/0151044 A1 | 8/2003 | Yamada |

(Continued)

FOREIGN PATENT DOCUMENTS

| CN | 102637795 A | 8/2012 |
| CN | 103746052 A | 4/2014 |

(Continued)

OTHER PUBLICATIONS

Applied Physics Letters 92, 261909 (2008).
(Continued)

*Primary Examiner* — Ratisha Mehta
(74) *Attorney, Agent, or Firm* — Holtz, Holtz & Volek PC (57) ABSTRACT

A light-emitting layer includes: a base layer with a plurality of base segments that have a composition subject to stress strain from a first semiconductor layer and are formed in a random net shape; and a quantum well structure layer including at least one quantum well layer and at least one barrier layer that are formed on the base layer. The base layer includes: a first sub-base layer; a trench that partitions the first sub-base layer for each of the plurality of base segments; and a second sub-base layer formed to bury the first sub-base layer.

7 Claims, 5 Drawing Sheets

(51) Int. Cl.
*H01L 33/22* (2010.01)
*H01L 33/32* (2010.01)
*H01L 33/00* (2010.01)
*H01L 33/14* (2010.01)

(56) References Cited

U.S. PATENT DOCUMENTS

| | | |
|---|---|---|
| 2005/0056850 A1 | 3/2005 | Taki |
| 2006/0131595 A1 | 6/2006 | Chen |
| 2006/0267026 A1 | 11/2006 | Kim et al. |
| 2007/0145386 A1 | 6/2007 | Lee et al. |
| 2008/0073657 A1 | 3/2008 | Liang et al. |
| 2008/0191190 A1 | 8/2008 | Tsai et al. |
| 2009/0121214 A1* | 5/2009 | Tu .................. H01L 33/06 257/13 |
| 2009/0173955 A1 | 7/2009 | Kim et al. |
| 2010/0244042 A1 | 9/2010 | Saito et al. |
| 2010/0289043 A1 | 11/2010 | Aurelien et al. |
| 2011/0210312 A1 | 9/2011 | Tu et al. |
| 2012/0077298 A1 | 3/2012 | Liang et al. |
| 2012/0205618 A1 | 8/2012 | Nakamura |
| 2013/0313517 A1 | 11/2013 | Choi |
| 2013/0320299 A1 | 12/2013 | Li |
| 2015/0179791 A1* | 6/2015 | Kudou ............. H01L 29/7813 257/77 |
| 2016/0043279 A1* | 2/2016 | Jean ................. H01L 33/325 257/13 |
| 2017/0317232 A1 | 11/2017 | Togawa et al. |

FOREIGN PATENT DOCUMENTS

| | | |
|---|---|---|
| EP | 2642536 A2 | 9/2013 |
| JP | 2004179493 A | 6/2004 |
| JP | 2005093682 A | 4/2005 |
| JP | 2006339646 A | 12/2006 |
| JP | 2008053608 A | 3/2008 |
| JP | 2008071805 A | 3/2008 |
| JP | 2008199016 A | 8/2008 |
| JP | 2008218746 A | 9/2008 |
| JP | 2009124149 A | 6/2009 |
| JP | 2011249460 A | 12/2011 |
| JP | 4984119 B2 | 7/2012 |
| KR | 100809229 B1 | 3/2008 |
| WO | 2012059837 A1 | 5/2012 |
| WO | 2013114152 A1 | 8/2013 |

OTHER PUBLICATIONS

U.S. Appl. No. 15/525,054; First Named Inventor: Yusaku Fujii; Title: "Semiconductor Light-Emitting Element"; filed May 6, 2017.
U.S. Appl. No. 15/525,055; First Named Inventor: Takako Fujiwara; Title: "Semiconductor Light-Emitting Element"; filed May 6, 2017.
U.S. Appl. No. 15/525,056; First Named Inventor: Meiki Goto; Title: "Semiconductor Light-Emitting Element"; filed May 6, 2017.
International Search Report (ISR) and Written Opinion dated Jul. 26, 2016 issued in International Application No. PCT/JP2016/058676.
U.S. Appl. No. 15/525,057; First Named Inventor: Hiroyuki Togawa; Title: "Semiconductor Light-Emitting Device"; filed May 6, 2017.
Extended European Search Report (EESR) dated Sep. 27, 2018 issued in European Application No. 16768675.7.

* cited by examiner

SEMICONDUCTOR LIGHT-EMITTING ELEMENT, AND MANUFACTURING METHOD FOR SAME

TECHNICAL FIELD

The present invention relates to a semiconductor light-emitting element, such as a light-emitting diode (LED), and to a method of manufacturing the same.

BACKGROUND ART

A semiconductor light-emitting element is usually manufactured by growing, on a growth substrate, a semiconductor structure layer including an n-type semiconductor layer, an active layer, and a p-type semiconductor layer and forming an n-type electrode and a p-type electrode that apply voltage to the n-type type semiconductor layer and the p-type semiconductor layer, respectively.

Patent Literature 1 discloses a white light-emitting diode in which red, green, and blue light-emitting diodes are layered in this order so as to emit light in the same direction. Patent Literature 2 discloses a GaN-based semiconductor light-emitting element including an uneven AlN layer disposed between an n-type layer and an active layer, wherein the active layer is unevenly formed on the basis of the shape of the uneven AlN layer.

CITATION LIST

Patent Literature

Patent Literature 1: Japanese Patent Application Laid-Open No. 2006-339646
Patent Literature 2: Japanese Patent Application Laid-Open No. 2005-093682

SUMMARY OF INVENTION

Technical Problem

A semiconductor light-emitting element emits light by binding (recombination), in the active layer, of an electron and hole injected into the element through electrodes. The wavelength of light emitted from the active layer (i.e. emitted light color) is determined by the band gap of the semiconductor material constituting the active layer. For example, a light-emitting element using a nitride-based semiconductor emits blue light from its active layer.

A light source is eventually required to have color rendering properties for, for example, lighting applications. A light source with high color rendering proprieties is a type of light source that emits near natural light. To achieve high color rendering properties, it is preferable that light whose wavelength substantially covers the entire wavelength of the visible region be extracted from a light source. For example, light extracted from a light source with high color rendering properties is observed as white light.

To cope with this, as disclosed in the aforementioned patent literature, various techniques of using a semiconductor light-emitting element to acquire white light are proposed. For example, in another proposed technique, by laminating a plurality of active layers with different compositions, the light-emitting wavelength bandwidth is broadened without using a phosphor. Also, in another proposed technique, an unevenly structured layer is inserted between an active layer and an n-type semiconductor layer to make the band gap non-uniform in the active layer and thereby broaden the light-emitting wavelength bandwidth.

However, a light-emitting apparatus manufactured using the aforementioned techniques have problems in terms of the uniformity of emitted light colors, the complexity of the manufacturing process, and the light-emitting intensity. Example causes include addition of a step of forming a semiconductor layer and a step of processing a semiconductor layer and degradation of the crystallinity of the semiconductor layer.

The present invention has been made in view of the aforementioned problems. An object of the present invention is to provide a semiconductor light-emitting element with high color rendering properties of a broad light-emitting wavelength bandwidth (spectral width) and a high light-emitting intensity and a manufacturing method thereof.

Solution to Problem

The semiconductor light-emitting element according to the present invention includes: a first semiconductor layer of a first conductivity type; a light-emitting functional layer including a light-emitting layer formed on the first semiconductor layer; and a second semiconductor layer that is of a conductivity type opposite to the conductivity type of the first semiconductor layer and is formed on the light-emitting functional layer. The light-emitting layer includes a base layer with a plurality of base segments that have a composition subject to stress strain from the first semiconductor layer and are formed in a random net shape, and a quantum well structure layer including at least one quantum well layer and at least one barrier layer that are formed on the base layer. The base layer includes a first sub-base layer, a trench that partitions the first sub-base layer for each of the plurality of base segments, and a second sub-base layer formed to bury the first sub-base layer.

The method of manufacturing a semiconductor light-emitting element according to the present invention includes: a step of forming a first semiconductor layer having a first conductivity type on a substrate; a step of forming, on the first semiconductor layer, a first sub-base layer with a groove that has a composition subject to stress strain from the first semiconductor and is formed in a random net shape; a step of forming a trench for removing the groove; a step of forming a second sub-base layer to bury the first sub-base layer; a step of forming, on the second sub-base layer, a quantum well structure layer including at least one quantum well structure layer and at least one barrier layer; and a step of forming, on the quantum well structure layer, a second semiconductor layer having a second conductivity type opposite to the first conductivity type.

DESCRIPTION OF EMBODIMENTS

Figures 1A, 1B:
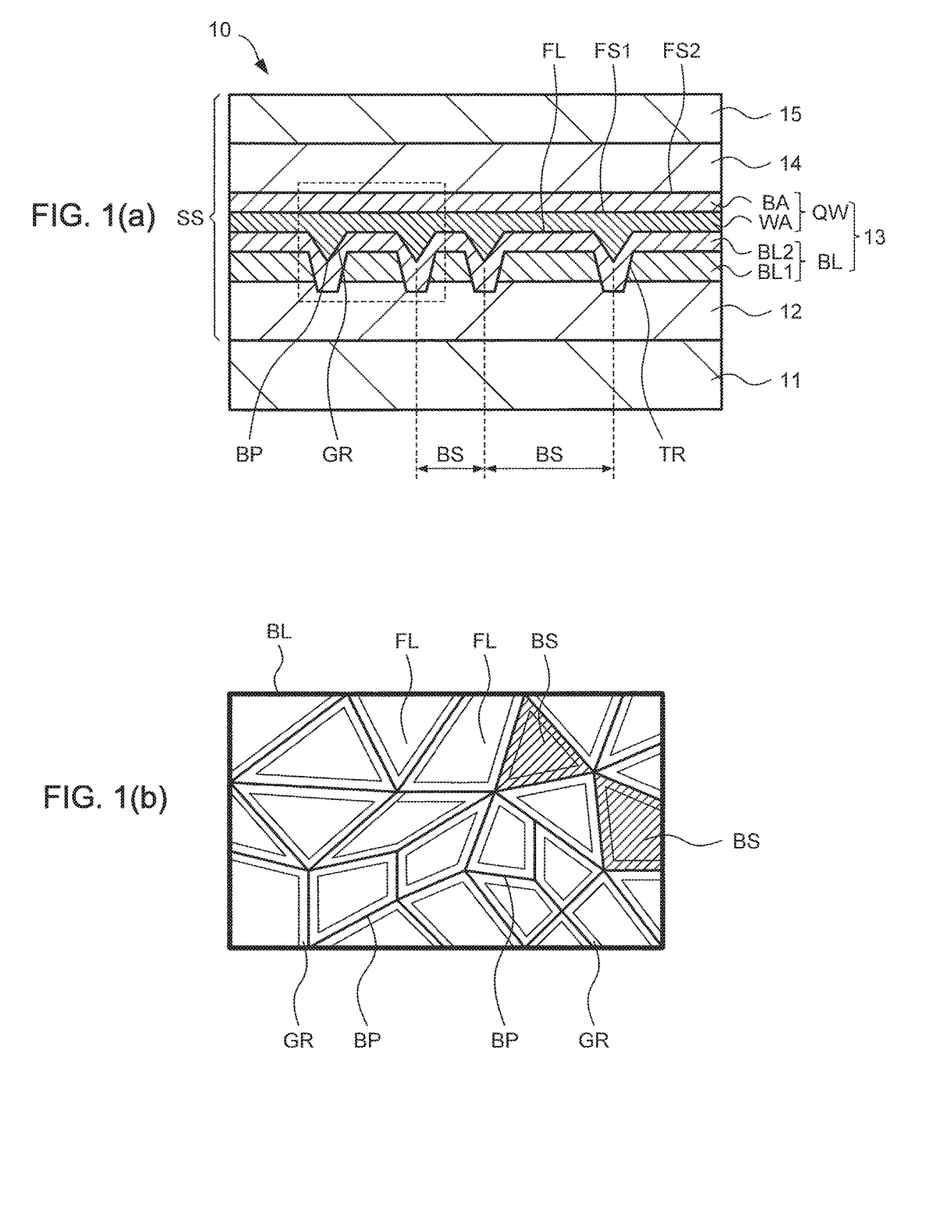
FIG. 1(a) is a cross-sectional view illustrating a structure of a semiconductor light-emitting element according to a first embodiment.
FIG. 1(b) is a top plan view schematically illustrating a base layer of a light-emitting layer.

Embodiments of the present invention will now be described in detail. In this specification, an identical reference numeral is assigned to an identical constituent element.
First Embodiment FIG. 1(a) is a cross-sectional view illustrating a structure of a semiconductor light-emitting element (hereinafter may be simply referred to as a light-emitting element or as an element) 10 according to a first embodiment. In the structure of the semiconductor light-emitting element 10, a semiconductor structure layer SS is formed on a mounting substrate (hereinafter may be simply referred to as a substrate) 11. The semiconductor structure layer SS includes an n-type semiconductor layer (first semiconductor layer) 12 formed on the mounting substrate 11, a light-emitting functional layer 13 including a light-emitting layer formed on the n-type semiconductor layer 12, an electron blocking layer 14 formed on the light-emitting functional layer 13, and a p-type semiconductor layer (second semiconductor layer whose conductivity type is opposite to that of the first semiconductor layer) 15 formed on the electron blocking layer 14.

In this embodiment, the mounting substrate 11 is a growth substrate used for growth of, for example, the semiconductor structure layer SS and is formed from, for example, sapphire, Si, or GaN. In addition, the semiconductor structure layer SS is formed from a nitride-based semiconductor. The semiconductor light-emitting element 10 can be manufactured by growing the semiconductor structure layer SS on a sapphire substrate, whose C surface serves as a crystal growth surface, using a Metal Organic Chemical Vapor Deposition (MOCVD) method. Although not illustrated in the drawings, the light-emitting element 10 has an n-electrode and a p-electrode that apply voltage to the n-type semiconductor layer 12 and the p-type semiconductor layer 15, respectively.

This embodiment is described with reference to the case of the structure of the light-emitting element 10 where the semiconductor structure layer SS is formed on the growth substrate 11 which serves as a growth substrate. However, this embodiment is not limited to the structure where the mounting substrate 11 serves as a growth substrate. For example, the structure of the semiconductor light-emitting element 10 may be, after growing the semiconductor structure layer SS on the growth substrate, formed by bonding the semiconductor structure layer SS onto another substrate (support substrate) and removing the growth substrate. In this case, the other substrate to be bonded is provided on the p-type semiconductor layer 15. The aforementioned substrate to be bonded can use materials with a high degree of heat dissipation, for example, Si, AlN, Mo, W, and CuW.

Although not illustrated in the drawings, a buffer layer (underlayer) may be provided between the mounting substrate 11 and the n-type semiconductor layer 12. In this embodiment, after an undoped GaN layer was grown on the sapphire substrate (mounting substrate 11) as a buffer layer, the n-type semiconductor layer 12 was layered on the undoped GaN layer.

The n-type semiconductor layer 12 is formed from, for example, a GaN layer including an n-type dopant (for example, Si). An electron blocking layer 14 is formed from, for example, an AlGaN layer. The p-type semiconductor layer 15 is formed from, for example, a GaN layer containing a p-type dopant (for example, Mg). The electron blocking layer 14 may contain a p-type dopant. Also, the p-type semiconductor layer 15 may have a contact layer on the principal surface opposite to the interface with the electron blocking layer 14.

The light-emitting functional layer 13 may have a plurality of light-emitting layers. However, this embodiment is described with reference to the case where the light-emitting functional layer 13 is formed from one light-emitting layer. The light-emitting layer 13 is formed on the n-type semiconductor layer 12 and has a quantum well (QW) structure.

The light-emitting layer 13 has a base layer BL having a different composition (crystal composition) from that of the n-type semiconductor layer 12. The base layer BL has a groove GR that is subject to stress from the n-type semiconductor layer 12 and is formed in a random net shape. Specifically, the groove GR is formed in a mesh shape formed by a plurality of combined groove portions created by stress strain, which is generated on the base layer BL due to the composition difference between the n-type semiconductor layer 12 and the base layer BL. The stress strain generated in the base layer BL is strain of the crystal structure of the base layer BL caused by the lattice constant difference between the n-type semiconductor layer 12 and the base layer BL.

The light-emitting layer 13 has a quantum well structure layer QW formed from a quantum well layer WA and a barrier layer BA formed on the base layer BL. The quantum well layer WA is formed on the base layer BL, and the barrier layer BA is formed on the quantum well layer WA. The base layer BL functions as a barrier layer for the quantum well layer WA.

A description will be hereinbelow given of the base layer BL with reference to FIG. 1(b). FIG. 1(b) is a schematic view illustrating the upper surface of the base layer BL. The base layer BL has many fine base segments BS with random sizes which are formed by division by the groove GR. Each of the base segments BS is demarcated to have a random net shape as the base layer has a composition subject to stress strain from the n-type semiconductor layer 12.

The groove GR is composed of groove portions whose lengths and shapes are random and different from each other. The groove GR is formed in a net (mesh) shape over the entire surface of the base layer BL. Each base segment BS is a portion (segment) that is formed by random division of the base layer BL by the groove GR. Furthermore, the upper surfaces of the base segments BS respectively have various shapes, such as substantially round and oval shapes or a polygonal shape.

As illustrated in FIG. 1(a), the groove GR is, for example, V-shaped and has a line-like bottom portion BP. In this embodiment, an end portion of each base segment BS is the bottom portion BP of the groove GR. Each base segment BS adjoins another base segment BS at the bottom portion BP.

Also, the base layer BL has a flattened portion FL, which corresponds to each base segment BS. The surface of the base layer BL is constituted of the flattened portion FL and the inner wall surface of the groove GR. Each flattened portion FL is defined by the groove GR for each base segment BS. The base segment BS has an upper surface composed of the flattened portion FL and a side surface composed of the inner wall surface of the groove GR.

Specifically, the flattened portion FL constitutes an upper surface of each base segment BS, and the inner wall surface of the groove GR constitutes a side surface of the base segment BS. Therefore, each base segment BS has an inclined side surface, and the shape of the cross section is, for example, substantially trapezoid.

As illustrated in FIG. 1(a), the base layer BL is includes: a first sub-base layer BL1; a trench TR that partitions the first sub-base layer BL1 for each of the base segments BS; and a second sub-base layer BL2 formed to bury the first sub-base layer BL1. In this embodiment, the trench TR formed on the first sub-base layer BL1 is formed to have a depth so as to extend from the surface of the first sub-base layer BL1 to the inside of the n-type semiconductor layer 12. In other words, the bottom portion of the trench TR is formed within the n-type semiconductor layer 12. Further, the first sub-base layer BL1 is partitioned into the base segments BS by the trench TR.

The second sub-base layer BL2 is formed on the surface of the first sub-base layer BL1 and the inner surface of the trench TR. Also, the flattened portion FL and the groove GR are formed on the surface of the second sub-base layer BL2. In other words, the surface of the second sub-base layer BL2 is formed as the surface of the base layer BL.

The light-emitting layer 13 has the quantum well layer WA formed on the base layer BL. The quantum well layer WA is formed to bury the groove GR. In this embodiment, the quantum well layer WA is formed on the second sub-base layer BL2. The upper surface of the quantum well layer WA is formed as a flattened surface (hereinafter referred to as a first flattened surface) FS1. The quantum well layer WA has an uneven shape corresponding to the groove GR at its interface with the base layer BL, whereas the upper surface of the quantum well layer WA is flattened. As illustrated in FIG. 1(a), the quantum well layer WA has the first flattened surface FS1 that has been flattened after burying the base layer BL. The quantum well layer WA is formed as a strained quantum well layer.

Further, the light-emitting layer 13 has the barrier layer BA formed on the quantum well layer WA. The two main surfaces of the barrier layer BA are formed as flattened surfaces. Specifically, the barrier layer BA is formed on the first flattened surface FS1 of the quantum well layer WA, and the upper surface of the formed barrier layer BA is formed as a flattened surface (hereinafter referred to as a second flattened surface) FS2.

Figure 2A:
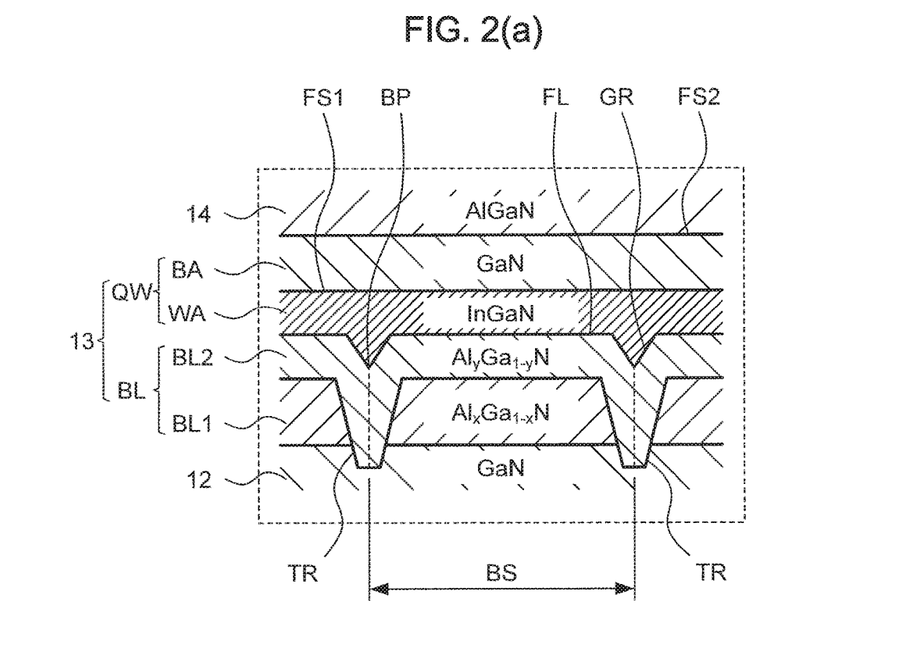
FIGS. 2(a) and 2(b) are partially enlarged cross-sectional views illustrating the structure of the light-emitting layer of the semiconductor light-emitting element according to the first embodiment.
Figure 2B:
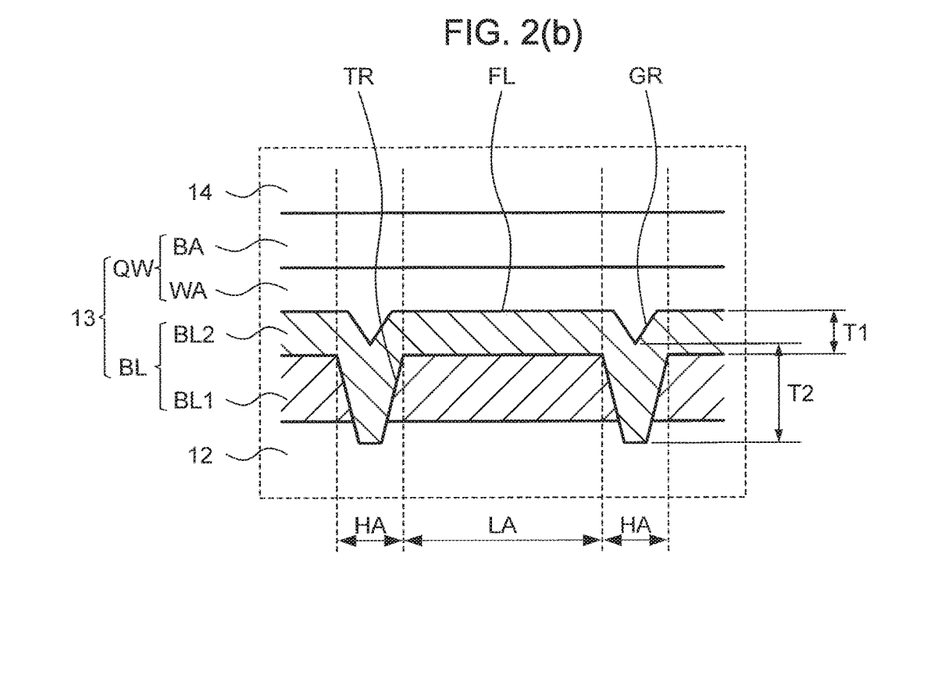

FIGS. 2(a) and 2(b) are cross-sectional views illustrating the structure of the light-emitting layer 13. FIG. 2(a) is a partially enlarged cross-sectional view illustrating the partially enlarged portion of FIG. 1(a) surrounded by the dashed line. A description will be hereinbelow given of the light-emitting layer 13 in more detail with reference to FIG. 2(a). The base layer BL of the light-emitting layer 13 has: the first sub-base layer BL1 with the composition of $Al_xGa_{1-x}N$ ($0<x\leq1$); and the second sub-base layer BL2 that is formed on the first sub-base layer BL1 and has the composition of $Al_yGa_{1-y}N$ ($0<y\leq1$). The quantum well layer WA has the composition of InGaN. The barrier layer BA has the composition of GaN. The electron blocking layer 14 has the composition of AlGaN.

The second sub-base layer BL2 is greater than or equal to the first sub-base layer BL1 in terms of Al composition y. In other words, the Al composition y of the second sub-base layer BL2 is greater than or equal to the Al composition x of the first sub-base layer BL1. In this embodiment, the Al composition y is greater than the Al composition x, and $0<x<y<1$ is satisfied.

Further, the second sub-base layer BL2 is formed to bury the first sub-base layer BL1. More specifically, the shape of the trench TR formed in the first base layer BL1 is followed by the second sub-base layer BL2 (i.e. the groove GR is provided in the area above the trench TR). However, the depth of the groove GR is smaller than the depth of the trench TR. Accordingly, as illustrated in FIG. 2(b), the layer thickness of the second sub-base layer BL at the flattened portion FL (layer thickness T1) is different from the layer thickness thereof at the groove GR (layer thickness T2). Specifically, the layer thickness T2 of the second sub-base layer BL2 at the groove GR portion (within the trench TR) is greater than the thickness thereof at the flattened portion FL (outside the trench TR). The angle of the side wall (groove GR) of the second sub-base layer BL2 is greater than the angle of the side wall (trench TR) of the first sub-base layer BL1.

Due to the relationship between the aforementioned first sub-base layer BL1 and second sub-base layer BL2 in terms of layer thickness and Al composition, the electric resistance value is not constant within the base layer BL. Specifically, the electric resistance value within the trench TR is greater than that outside the trench TR. Therefore, as illustrated in FIG. 2(b), the base layer BL has: a high resistance area HA that corresponds to the area within the trench TR and has a high electric resistance value; and a low resistance area LA that corresponds to the area on the flattened portion FL (outside the trench TR) and a low electric resistance value.

A description will be hereinbelow given of the light-emitting layer 13. In the base segment BS of the base layer BL, AlGaN layers BL1 and BL2 as the base layer BL can be grown and formed on a GaN layer as the n-type semiconductor layer 12 at a relatively low growth temperature.

When the base layer BL different from the aforementioned base layer BL in terms of crystal composition is grown on the n-type semiconductor layer 12, stress (strain) is generated in the base layer BL. For example, the base layer BL has a smaller lattice constant than that of the n-type semiconductor layer 12. For example, when an AlGaN layer as the first sub-base layer BL1 is grown on a GaN layer as the n-type semiconductor layer 12, tensile strain is exerted in the AlGaN layer due to the GaN layer. Accordingly, the AlGaN layer grows in a three-dimensional manner. Specifically, the AlGaN layer grows in a stereoscopic manner, and a plurality of fine protrusions and recesses (i.e. base segments BS) are formed.

When an InGaN layer is formed as the quantum well layer WA on the base layer BL, the quantum well layer WA is formed as a strained quantum well layer. Also, the In content is distributed differently depending on the region within the quantum well layer WA. Specifically, the quantum well layer WA is formed such that, for example, the region on the flattened portion FL differs from the region on the groove GR in terms of In composition. The layer thickness of the quantum well layer WA on the upper surface of the base segment BS is different from that on the side surface of the base segment BS. Thus, the band gap is not constant within the quantum well layer WA. The light-emitting layer 13, which has fine island-shaped protrusions and recesses, emits various colors of light.

The present inventors focused on non-radiative recombination performed by many carriers in the region between the base segments BS, specifically, in the region of the groove GR, when the base layer BL does not have the trench TR. Specifically, when the base layer BL does not have the trench TR, in the semiconductor structure layer SS, the current flow concentrates in the region of the groove GR whose resistance is lower than that of the flattened portion FL in the base layer BL. The region of the groove GR is a portion where the level of crystallinity is lower than that of the flattened portion FL, and the current (carrier) flowing in the region of the groove GR is unlikely to contribute to light emission.

In contrast, as described above, in this embodiment, the base layer BL has two sub-base layers BL1 and BL2. Further, the first base layer BL1 has the trench TR formed to remove the region that corresponds to the groove GR and has a relatively low level of crystallinity. In addition, the second sub-base layer BL2 is formed to bury (covering an entirety of) the first base layer BL1. Therefore, a decrease in the light-emitting efficiency due to a current flowing in a low-crystallinity region is restrained. As well, the light-emitting wavelength bandwidth is broadened by forming the quantum well layer WA on the second sub-base layer BL2. Specifically, light with a broad light-emitting wavelength spectrum width and a high level of light-emitting intensity is emitted from the light-emitting layer 13. Therefore, the light-emitting element 10 has high color rendering properties and a high light-emission intensity.

In addition, as illustrated in FIG. 2(b), the first sub-base layer BL1 and the second sub-base layer BL2 have the aforementioned relationship in terms of Al composition and layer thickness, whereby the area within the trench TR is the high resistance area HA and the area outside the trench TR is the low resistance area LA. Accordingly, a large amount of current flows in the region outside the trench TR (region on the flattened portion FL) with a relatively high level of crystallinity. The light-emitting efficiency thereby further enhances.

Also, in the configuration of this embodiment, a large amount of current flows in the region on the flattened portion FL. However, in a hypothetical situation where a current flows only in the flattened portion FL, light with a broad spectral width can be obtained. More specifically, the layer thickness of the quantum well layer WA is near constant on the flattened portion FL, but the level of stress exerted by the base layer BL is not constant. Specifically, the level of strain is not constant in the region on the flattened portion FL. Therefore, the band gap fluctuates not only in the region of the groove GR, but also within an entirety of the quantum well layer WA. Accordingly, enhancement of the light-emitting efficiency and broadening of the light-emitting wavelength bandwidth can be simultaneously achieved.

As the size of the base segment BS decreases, the amount of In introduced into the base layer BL increases, and the light-emission wavelength shifts toward the long wavelength side. In addition, by forming an InGaN layer on the second sub-base layer BL2 with a high Al composition y, an InGaN layer with a high In composition can be formed. The band gap of the InGaN layer, in other words, the energy between quantum levels, thereby decreases. The quantum well layer WA emits light with a light-emission wavelength on the longer wavelength side.

In terms of the color rendering proprieties, in other words, broadening of the spectrum bandwidth, it is preferable to make the size of the base segment BS smaller. Accordingly, it is preferable that the second sub-base layer BL2 have a high Al composition, for example, the second sub-base layer BL2 have an AlN composition. The quantum well layer WA is thereby subject to significant strain, and the band gap thereof fluctuates.

This embodiment is described with reference to the case where the Al composition y of the second sub-base layer BL2 is greater than the Al composition x of the first sub-base layer BL1. However, the Al composition x and the Al composition y may be set equal when the region within the trench TR can be made as the high resistance area HA. Specifically, the Al composition y should be greater than or equal to the Al composition x. For example, both the first sub-base layer BL1 and the second sub-base layer BL2 may have the AlN composition (i.e. x=y=1 may be satisfied).

This embodiment is described with reference to the case where the base layer BL includes the flattened portion FL and the groove GR. However, the surface shape of the base layer BL is not limited to the aforementioned case. For example, the base segment BS may have a curved upper surface.

This embodiment is described with reference to the case where the quantum well structure layer QW is structured to include one quantum well layer WA and one barrier layer BA. However, the embodiment is not limited to this case. The quantum well structure layer QW may be constituted of a plurality of quantum well layers WA and a plurality of barrier layers BA. In other words, the quantum well structure layer QW may have a single quantum well (SQW) structure or a multi quantum well (MQW) structure. Specifically, the quantum well structure layer QW should include at least one quantum well layer WA and at least one barrier layer BA that are formed on the base layer BL.

FIGS. 3(a) to 3(d) are views illustrating a method of manufacturing the semiconductor light-emitting element 10 according to the first embodiment. As described above, the semiconductor light-emitting element 10 can be formed by, for example, the MOCVD method.

[Formation Process of the n-Type Semiconductor Layer 12 and the First Sub-Base Layer BL1]

Figure 3A:
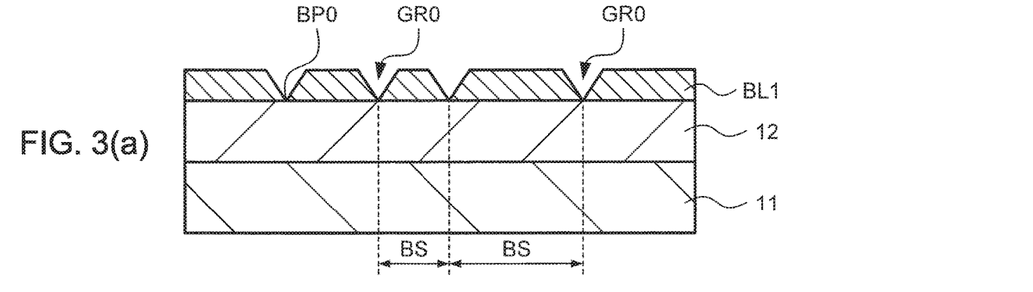
FIGS. 3(a) to 3(d) are cross-sectional views illustrating a method of manufacturing the semiconductor light-emitting element according to the first embodiment.

FIG. 3(a) is a cross-sectional view illustrating a wafer in which the first sub-base layer BL1 is formed. Firstly, the n-type semiconductor layer 12 is formed on the growth substrate 11. In this embodiment, a sapphire substrate was used as the growth substrate 11, and a buffer layer (not illustrated in the drawings) was formed on the sapphire substrate. Next, an n-GaN layer was formed as the n-type semiconductor layer 12 on the buffer layer.

Next, the first sub-base layer BL1, which has a composition subject to stress strain from the n-type semiconductor layer 12 and has a groove GR0 formed in a random net shape, is formed on the n-type semiconductor layer 12. In this embodiment, on the n-GaN layer 12, an AlGaN layer was formed as the first sub-base layer BL1. In this case, the AlGaN layer was grown in a three-dimensional manner by setting the growth temperature to a low temperature. The groove GP0 was thereby (spontaneously) formed within the AlGaN layer.

[Formation Process of the Trench TR]

Figure 3B:
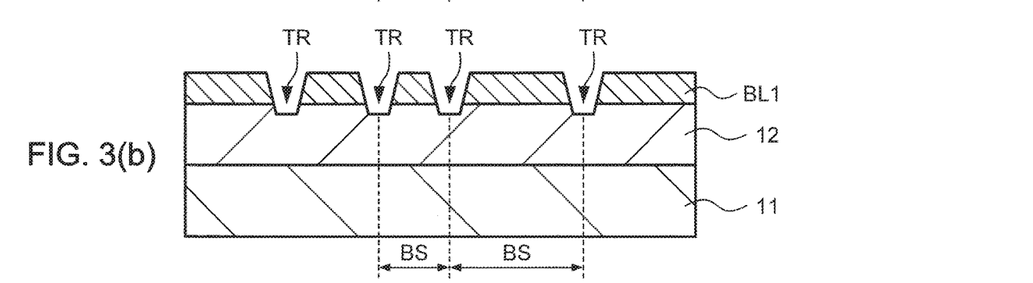

FIG. 3(b) is a cross-sectional view of a wafer in which the trench TR is formed on the first sub-base layer BL1. Next, as illustrated in FIG. 3(b), the trench TR for removing the groove GR0 formed on the first sub-base layer BL1 is formed. In this embodiment, the trench TR was formed by etching the first sub-base layer BL1 using $H_2$ gas.

It is known that when AlGaN and GaN are exposed to $H_2$ at a high temperature, a low-crystallinity portion of AlGaN or GaN is etched preferentially. Therefore, by performing gas etching using $H_2$ on an AlGaN layer as the first sub-base layer BL1, the groove GR0 (relatively low-crystallinity portion) can be selectively etched. In this manner, the groove GR0 can be readily removed, and a portion of the first sub-base layer BL1 other than the groove GR0 can be left. Therefore, it is preferable that a step of forming the trench TR include a step of etching the first sub-base layer BL1 using $H_2$ gas.

In this embodiment, the trench TR was formed to have a depth to reach the inside of the n-type semiconductor layer 12 (GaN layer). Specifically, at the portion of the groove GR0, the n-type semiconductor layer 12 is partially etched (removed). Therefore, the groove GR0 is completely removed, and a low-crystallinity portion has been completely removed. By completely removing the groove GR0, non-radiative recombination by carriers at the groove GR0, in other words, decrease in the light-emitting efficiency, can be restrained.

[Formation Process of the Second Sub-Base Layer BL2]

Figure 3C:
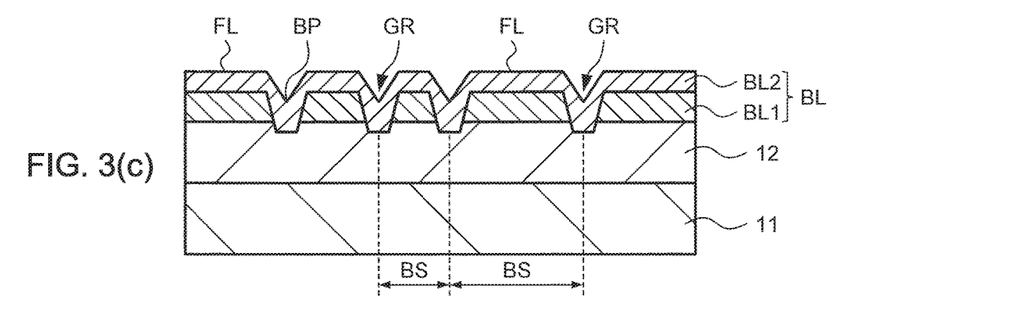

FIG. 3(c) is a cross-sectional view illustrating a wafer in which the second sub-base layer BL2 is formed. As illustrated in FIG. 3(c), the second sub-base layer BL2 is formed to bury the first sub-base layer BL1. Specifically, as described above, as the second sub-base layer BL2, an AlGaN layer with an Al composition (composition y) greater than that of the first sub-base layer BL1 was formed. The second sub-base layer BL2 is formed to have the flattened portion FL and the groove GR that follows the shape of the trench TR. Specifically, the second sub-base layer BL2 is formed so that its upper surface is not completely flattened.

[Formation Processes of the Quantum Well Structure Layer QW, the Electron Blocking Layer 14, and the p-Type Semiconductor Layer 15]

Figure 3D:
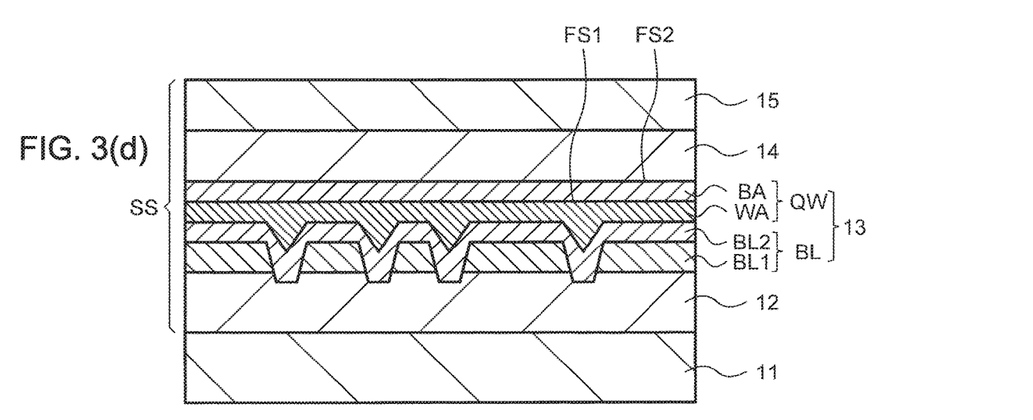

Subsequently, as illustrated in FIG. 3(d), the quantum well structure layer QW including at least one quantum well layer WA and at least one barrier layer BA is formed to bury the second sub-base layer BL2. In this embodiment, one InGaN layer and one GaN layer were formed as the quantum well layer WA and the barrier layer BA, respectively. Next, the electron blocking layer 14 is formed on the barrier layer BA. In this embodiment, an AlGaN layer was formed as the electron blocking layer 14. Subsequently, the p-type semiconductor layer 15 is formed on the electron blocking layer 14. In this embodiment, a p-GaN layer was formed as the p-type semiconductor layer 15.

Also, although not illustrated in the drawings, an n-electrode and a p-electrode that apply voltage to the n-type semiconductor layer 12 and the p-type semiconductor layer 15, respectively, were formed, and the wafer was divided on a per-element basis to produce the semiconductor light-emitting element 10.

In this embodiment, the layer thickness of the first sub-base layer BL1 was set to 4 nm. Also, the layer thickness of the second sub-base layer BL2 was set to 1.5 nm.

In this embodiment, the first sub-base layer BL1 is formed, and the trench TR for removing the groove GR0 (low-crystallinity portion) is formed. Also, after the second sub-base layer BL2 is formed to bury the first sub-base layer BL1, the quantum well structure layer QW is formed. The semiconductor light-emitting element 10 with a high light-emission efficiency and high color rendering proprieties can thereby be manufactured.

Figure 4:
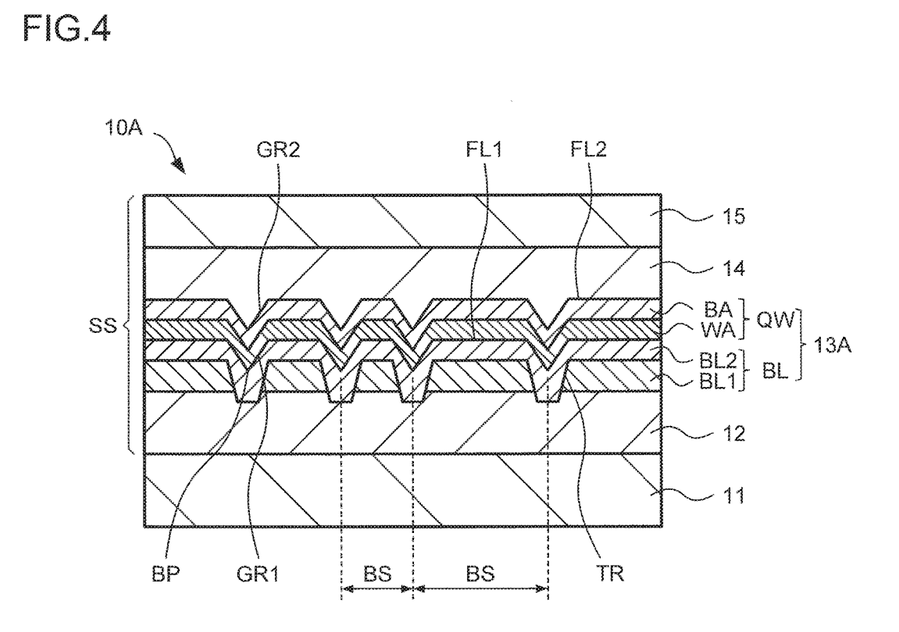
FIG. 4 is a cross-sectional view illustrating the structure of a semiconductor light-emitting element according to a modified example of the first embodiment.

FIG. 4 is a cross-sectional view illustrating the structure of a semiconductor light-emitting element 10A according to a modified example of the first embodiment. The structure of the semiconductor light-emitting element 10A is identical to that of the semiconductor light-emitting element 10 except for the structure of a light-emitting layer 13A.

In the semiconductor light-emitting element 10 shown by the first embodiment, the upper surface of the light-emitting layer 13 is completely flattened. More specifically, the quantum well layer WA and the barrier layer BA are formed to completely bury the groove GR of the base layer BL. The upper surfaces of the quantum well layer WA and the barrier layer BA are formed as the first flattened surface FS1 and the second flattened surface FS2, respectively. On the other hand, as illustrated in FIG. 4, in the semiconductor light-emitting element 10A according to this modified example, the upper surface of the light-emitting layer 13A has a groove GR2, which follows the groove GR1 of the base layer BL (groove equivalent to the groove GR in the light-emitting layer 13). Specifically, the region of the upper surface of the light-emitting layer 13A directly above the flattened portion FL1 is formed as a flattened portion FL2, and a recess portion (groove GR2) is formed at the location directly above the groove GR1.

According to this modified example, the base segment BS is not completely buried by the quantum well layer WA and the barrier layer BA. The base layer BL functions effectively for the quantum well layer WA with an upper surface of the aforementioned type of uneven structure. The semiconductor light-emitting element 10A with a high light-emission efficiency and high color rendering proprieties can be provided. Specifically, the quantum well layer WA and the barrier layer BA should be formed on the base layer BL.

Second Embodiment

Figure 5:
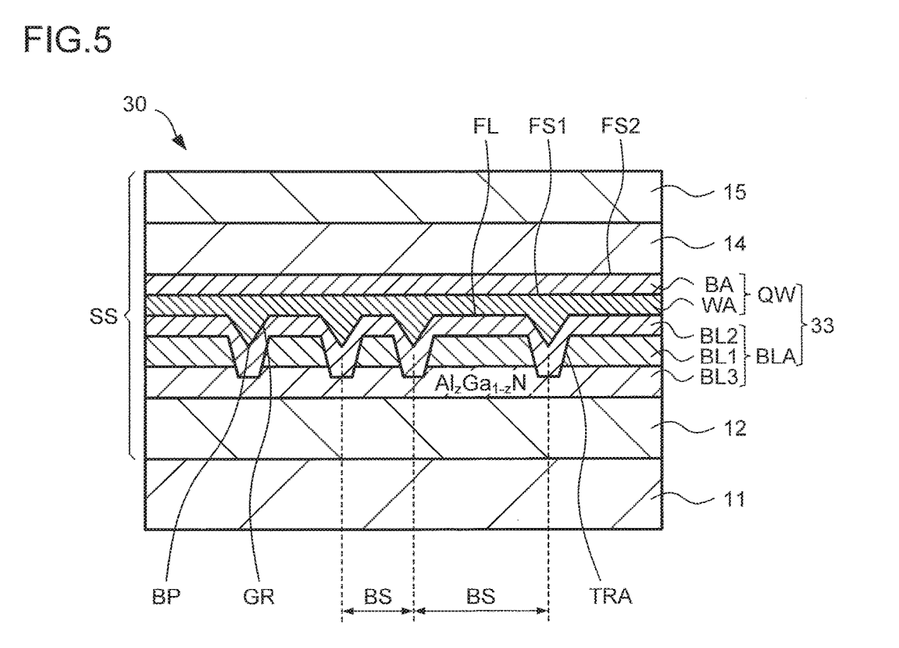
FIG. 5 is a cross-sectional view illustrating a structure of a semiconductor light-emitting element according to a second embodiment.

FIG. 5 is a cross-sectional view illustrating a structure of a semiconductor light-emitting element 30 according to a second embodiment. Except for the structure of a light-emitting functional layer (light-emitting layer) 33, the configuration of the light-emitting element 30 is the same as that of the light-emitting element 10. The light-emitting layer 33 has a base layer BLA including three sub-base layers. The light-emitting layer 33 has: a third sub-base layer BL3 formed on the n-type semiconductor layer 12; the first sub-base layer BL1 that is formed on the third sub-base layer BL3 and has a trench TRA that reaches the third sub-base layer BL3 through the base segments BS; and the second sub-base layer BL2 formed to bury the first sub-base layer BL1. As in the case of the base layer BL, the base layer BLA has a plurality of the base segments BS that have a composition subject to stress strain from the n-type semiconductor layer 12 and are formed in a random net shape.

In this embodiment, the base layer BLA has the third sub-base layer BL3 between the n-type semiconductor layer 12 and the first sub-base layer BL1. The third sub-base layer BL3 is formed from an AlGaN layer with a smaller AL composition than those of the first sub-base layer BL1 and the second sub-base layer BL2. Specifically, the third sub-base layer BL3 has the composition of $Al_zGa_{1-z}N$ ($0 \leq z < x \leq y = 1$). For example, the third sub-base layer BL3 is formed from an undoped AlGaN or GaN layer. The first sub-base layer BL1 has a composition subject to stress strain from the third sub-base layer BL3. The third sub-base layer BL3 has a thickness of, for example, 10 nm.

In this embodiment, the trench TRA formed on the first sub-base layer BL1 is formed to have a depth to reach the inside of the third sub-base layer BL3. Therefore, the trench TR is not formed within the n-type semiconductor layer 12. Accordingly, the crystallinity of the interface between the n-type semiconductor layer 12 and the light-emitting layer 33 is ensured. Also, by forming an AlGaN layer with a small Al composition z as the third sub-base layer BL3, the base layer BLA with a preferable level of crystallinity overall can be formed. Accordingly, the light-emitting efficiency increases. Also, as in the case of the first embodiment, the current flow is restrained from being concentrated in an area between the relatively low-crystallinity portions of the base segments BS. Accordingly, the light-emitting efficiency increases. In addition, the surface of the base layer BLA has the groove GR formed to follow the shape of the trench TR. By the quantum well structure layer QW with the strained quantum well layer WA, light with a broad spectral width can be generated. Therefore, high color rendering proprieties are ensured.

By adjusting the Al composition z of the third sub-base layer BL3, the stress strain exerted on the first sub-base layer BL1 formed on the third sub-base layer BL3 can be adjusted. Specifically, by the Al composition z of the third sub-base layer BL3, the size of the base segment BS can be adjusted. Therefore, the emitted light color can be adjusted at a higher level of freedom.

Figure 6:
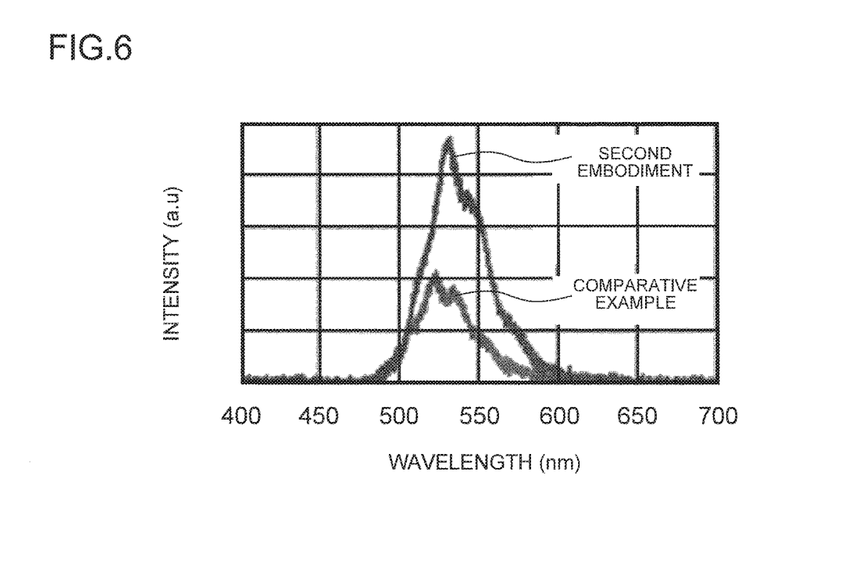
FIG. 6 is a view illustrating a light emission spectrum of the semiconductor light-emitting element according to the second embodiment.

FIG. 6 is a view illustrating the light emission spectrum of the semiconductor light-emitting element 30 according to the second embodiment. In FIG. 6, the horizontal axis represents the wavelength, and the vertical axis represents the light-emitting intensity. For comparison with the light emission spectrum of the semiconductor light-emitting element 30, a light-emitting element was produced as a comparative example so that the comparative example had base layers identical to those of the light-emitting element 30 except that the trench TRA was not formed. As illustrated in FIG. 6, the light-emitting element 30 could emit light with a broad spectral width and had high color rendering proprieties.

Also, the peak light-emitting intensity of the light-emitting element 30 is approximately 1.5 times greater than that of the comparative example. Possible causes are as follows: the portion with a relatively low level of crystallinity formed on the first sub-base layer BL1 is removed by the trench TRA; and due to the second sub-base layer BL2, the resistance of the trench TRA is higher than the other portions, whereby it is difficult for a current to flow in the area within the trench TRA, and specifically, a large amount of current flows in a portion with a preferable level of crystallinity other than the trench TRA (for example, the area of the flattened portion FL), and many carriers recombine to cause light emission.

Figure 7:
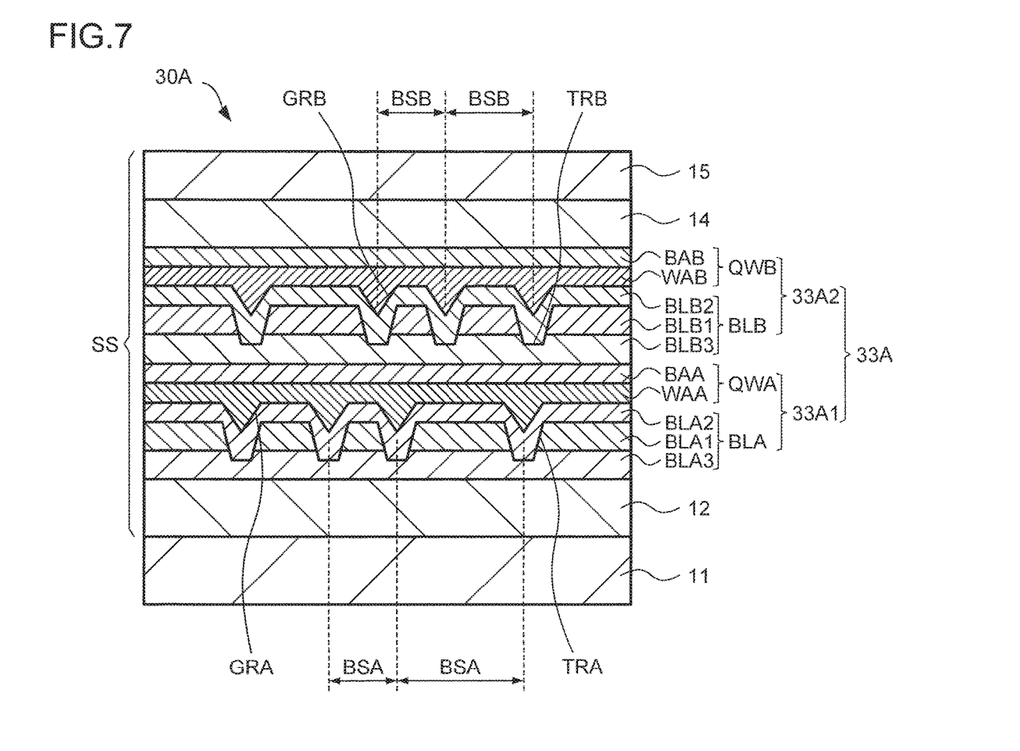
FIG. 7 is a cross-sectional view illustrating a structure of a semiconductor light-emitting element according to a modified example of the second embodiment.

FIG. 7 is a cross-sectional view illustrating a structure of a semiconductor light-emitting element 30A according to a modified example of the second embodiment. Except for the structure of the light-emitting functional layer 33A, the structure of the light-emitting element 30A is the same as that of the light-emitting element 30. In the structure of the light-emitting functional layer 33A, the first light-emitting layer 33A1 and the second light-emitting layer 33A2 are stacked. The structures of the first light-emitting layer 33A1 and the second light-emitting layer 33A2 are identical to that of the light-emitting layer 33. Specifically, in the structure of the light-emitting functional layer 33A, a plurality of the light-emitting layers 33 are stacked.

Specifically, the structure of the first light-emitting layer 33A1 is identical to that of the light-emitting layer 33. Specifically, the configurations of the first sub-base layer BL1, the second sub-base layer BL2, the third sub-base layer BL3, and the trench TRA are identical to those of the first sub-base layer BL1, the second sub-base layer BL2, the third sub-base layer BL3, and the trench TRA of the light-emitting layer 33. Also, the quantum well structure layer QWA of the first light-emitting layer 33A1 has a quantum well structure layer WAA and a barrier layer BAA, whose configurations are identical to those of the quantum well structure layer WA and the barrier layer BA, respectively, of the light-emitting layer 33. Also, the base layer BLA of the first light-emitting layer 33A1 has a plurality of base segments BSA that have a composition subject to stress strain from the n-type semiconductor layer 12 and are formed in a random net shape.

The second light-emitting layer 33A2 has a base layer BLB and a quantum well structure layer QWB formed on the quantum well structure layer QWA (barrier layer BAA) of the first light-emitting layer 33A1. The base layer BLB has a plurality of base segments BSB that have a composition subject to stress strain from the barrier layer BAA of the first light-emitting layer 33A1 and are formed in a random net shape. The base layer BLB has a first sub-base layer BLB1, a second sub-base layer BLB2, and a third sub-base layer BLB3, whose configurations are identical to those of the first sub-base layer BLA1, the second sub-base layer BLA2, and the third sub-base layer BLAS. Also, the first sub-base layer BLA1 has a trench TRB that reaches the third sub-base layer BL3 through the base segments BSB. In addition, the configuration of the quantum well structure layer QWB is identical to those of the quantum well structure layer QWA and the barrier layer BAA of the first light-emitting layer 33A1. The electron blocking layer 14 is formed on the barrier layer BAB.

According to this modified example, by adjusting the Al composition and layer thickness of the base layers BLA and BLB of the first light-emitting layer 33A1 and the second light-emitting layer 33A2, the size and depth of grooves GRA and GRB formed on the surfaces of the base layers BLA and BLB can be adjusted. For example, the compositions of the base layers BLA and BLB of the first light-emitting layer 33A1 and the second light-emitting layer 33A2 are different from each other. Thereby, the light-emitting wavelength from the quantum well structure layers QWA and QWB can be adjusted, and a broader spectral width can be acquired.

Also, by flattening the surface of the first light-emitting layer 33A1 (surface of the barrier layer BAA) and the surface of the second light-emitting layer 33A2 (surface of the barrier layer BAB), the grooves GRA and GRB can be formed so that their locations and sizes are not related to each other. Specifically, the base segments BSA and BSB can be formed so as not to be related to each other. Accordingly, the light emission spectrum can be adjusted at a greater level of freedom.

This modified example is described with reference to the case where the light-emitting functional layer 33A comprises the first light-emitting layer 33A1 and the second light-emitting layer 33A2. However, the light-emitting functional layer 33A may have another light-emitting layer. For example, between the n-type semiconductor layer 12 and the first light-emitting layer 33A1 or between the second light-emitting layer 33A2 and the electron blocking layer 14, there may be a light-emitting layer (third light-emitting layer) of a structure where at least one uniformly flattened quantum well layer is held between a plurality of barrier layers. For example, when a plurality of barrier layers formed from GaN and quantum well layers formed from InGaN are layered and formed as the third light-emitting layer, emission of light with a peak in a pure blue region can be achieved. Thereby, the light-emitting intensity on the short wavelength side can be supplemented, and the color rendering proprieties are enhanced more.

The case of forming the electron blocking layer 14 between the light-emitting functional layer (light-emitting layer) 13, 33, and 33A and the p-type semiconductor layer 15 is hereinabove described. However, the above embodiments are not limited to formation of the electron blocking layer 14. For example, the p-type semiconductor layer 15 may be formed on the light-emitting functional layer 13.

The electron blocking layer 14 has a larger band gap than those of the n-type semiconductor layer 12, the light-emitting functional layer 13, and the p-type semiconductor layer 15. Accordingly, an electron can be restrained from passing through the light-emitting functional layer 13 and overflowing to the side of the p-type semiconductor layer 15. Accordingly, it is preferable to dispose the electron blocking layer 14 during large-current driving and high-temperature operation.

The first and second embodiments and the modified examples thereof can be combined with each other. For example, a light-emitting functional layer including the light-emitting layer 13 and the light-emitting layer 33 can be formed.

In this embodiment and the modified example thereof, the light-emitting layer 13 has: the base layer BL with a plurality of the base segments BS that have a crystal composition subject to stress strain from the n-type semiconductor layer 12 and are formed in a random net shape; and a quantum well structure layer including at least one quantum well layer WA and at least one barrier layer BA that are formed on the base layer BL. The base layer has: a first sub-base layer; a trench that partitions the first sub-base layer for each of a plurality of base segments; and a second sub-base layer formed to bury the first sub-base layer.

Also, the base layer is formed by performing: a step of forming a first sub-base layer with a groove that has a composition subject to stress strain from an n-type semiconductor layer (or barrier layer) and is formed in a random net shape; a step of forming a trench for removing the groove; and a step of forming a second sub-base layer to bury the first base layer. Therefore, a light-emitting element with a high level of light-emitting efficiency and high color rendering proprieties can be certainly manufactured.

The embodiments are described with reference to the cases where the first conductivity type is an n-conductivity type and the second conductivity type is a p-conductivity type. However, the first conductivity type may be a p-type, and the second conductivity type may be an n-type.

REFERENCE SIGNS LIST 10, 10A, 30, 30A light-emitting element
12 n-type semiconductor layer (first semiconductor layer)
13, 33, 33A, 33A1, 33A2 light-emitting functional layer (light-emitting layer)
14 electron blocking layer
15 p-type semiconductor layer (second semiconductor layer)
BL, BLA, BLB base layer
BL1, BLA1, BLB1 first sub-base layer
BL2, BLA2, BLB2 second sub-base layer
BL3, BLAS, BLB3 third sub-base layer
BS, BSA, BSB base segment
GR, GR0, GRA, GRB groove

The invention claimed is:

1. A semiconductor light-emitting element comprising:
a first semiconductor layer of a first conductivity type and having a composition of GaN;
a light-emitting functional layer including a light-emitting layer formed on the first semiconductor layer; and
a second semiconductor layer that is of a conductivity type opposite to the conductivity type of the first semiconductor layer and is formed on the light-emitting functional layer,
wherein:
the light-emitting layer includes a base layer with a plurality of base segments that have a composition subject to stress from the first semiconductor layer and are formed in a random net shape, and a quantum well structure layer including at least one quantum well layer each having a composition of InGaN and at least one barrier layer that are formed on the base layer, and
the base layer includes a first sub-base layer, a trench that partitions the first sub-base layer for each of the plurality of base segments, and a second sub-base layer formed to bury the first sub-base layer, the first sub-base layer having a composition of AlGaN, and the second sub-base layer being formed from AlGaN that has an Al composition that is greater than an Al composition of the first sub-base layer.

2. The semiconductor light-emitting element according to claim 1, wherein the trench is formed to have a depth so as to extend from a surface of the first sub-base layer to an inside of the first semiconductor layer.

3. The semiconductor light-emitting element according to claim 1, wherein:
the base layer further includes a third sub-base layer formed between the first semiconductor layer and the first sub-base layer; and
the trench is formed to have a depth so as to extend from a surface of the first sub-base layer to an inside of the third sub-base layer.

4. The semiconductor light-emitting element according to claim 3, wherein the light-emitting functional layer has a structure in which a plurality of the light-emitting layers are stacked.

5. The semiconductor light-emitting element according to claim 4, wherein each of the base layers of the plurality of the light-emitting layers has a different composition.

6. A method of manufacturing a semiconductor light-emitting element, the method comprising:
forming, on a substrate, a first semiconductor layer having a first conductivity type and having a composition of GaN;
forming, on the first semiconductor layer, a first sub-base layer with a groove that is formed in a random net shape, the first sub-base layer having a composition of AlGaN subject to stress from the first semiconductor layer;
forming a trench for removing the groove;
forming a second sub-base layer to bury the first sub-base layer, the second sub-base layer being formed from AlGaN that has an Al composition that is greater than an Al composition of the first sub-base layer;
forming, on the second sub-base layer, a quantum well structure layer including at least one quantum well layer each having a composition of InGaN and at least one barrier layer; and
forming, on the quantum well structure layer, a second semiconductor layer having a second conductivity type opposite to the first conductivity type.

7. The method of manufacturing a semiconductor light-emitting element according to claim 6, wherein:
forming the trench comprises etching the first sub-base layer using $H_2$ gas.

* * * * *